United States Patent [19]
Wang et al.

[11] Patent Number: 5,747,365
[45] Date of Patent: May 5, 1998

[54] METHOD FOR PREPARING SEMICONDUCTOR CHIP AS SEM SPECIMEN

[75] Inventors: Wonder D. Wang; Shean-Ren Horng; Fei-Chi Huang, all of Hsinchu, Taiwan

[73] Assignee: Taiwan Semiconductor Manufacturing Company, Ltd., Hsin-Chu, Taiwan

[21] Appl. No.: 691,087

[22] Filed: Aug. 1, 1996

[51] Int. Cl.$^6$ .............................. G01R 31/26; H01L 21/66
[52] U.S. Cl. ............................... 438/17; 438/977
[58] Field of Search ...................... 438/17, 977; 324/765

[56] References Cited

U.S. PATENT DOCUMENTS

| | | | |
|---|---|---|---|
| 3,495,170 | 2/1970 | Biard et al. | 324/765 |
| 4,473,795 | 9/1984 | Wood | 438/17 |
| 4,878,315 | 11/1989 | Dawson et al. | 51/165 |
| 5,159,752 | 11/1992 | Mahant-Shetti et al. | 324/765 |

*Primary Examiner*—Brian Dutton
*Attorney, Agent, or Firm*—George O. Saile; Stephen B. Ackerman; William Robertson

[57] ABSTRACT

An improved method for grinding a semiconductor chip to prepare it for scanning with SEM to view a defect includes the step of forming an electrically conductive coating on the top surface of the chip. The coating is made under a mask that produces a U shaped conductive pattern so that an electrical path is formed on the top surface of the chip between two corners of the pattern. An initial resistance measurement is made for this path and a known amount of the chip below the U shape is ground away and a second resistance measurement is made. From these measurements, a calculation is made that gives the resistance when the chip has been ground to a selected section line. The grinding operation then proceeds until this resistance is reached, and the usual practice of visually checking the chip during the grinding operation is avoided. The mask creates a point at the bottom of the U shape that points to the defect.

10 Claims, 3 Drawing Sheets

METHOD FOR PREPARING SEMICONDUCTOR CHIP AS SEM SPECIMEN

FIELD OF THE INVENTION

This invention relates to a method for preparing a section of a semiconductor chip that is to be viewed with a scanning electron microscope (SEM). More specifically the invention relates to a method for detecting when a grinding operation has removed a sufficient portion of a semiconductor chip to expose the section that is to be viewed.

INTRODUCTION

Semiconductor chips have diffusions and other structures with dimensions that may be a fraction of a micron, and an SEM is commonly used for viewing these structures. As a relevant example, an SEM is commonly used for inspecting a defect in a semiconductor chip.

A test with a SEM can be made at any stage of the manufacturing process, but commonly it is made after the chip has been completed and has been electrically tested. If a defect is caused by a foreign particle in the structure, the particle may cause a bump in the surface which can be seen. Defective diffusions may be visible through the overlying wiring and insulation, or the position of a defect covered by wiring and insulation may be inferred from data from an electrical test. For example it may be known that a particular junction has failed, and the physical location of the junction can be established. Nearby visible surface structures can be used to mark a location that is to be viewed. From a more general standpoint, an SEM can be used to view any point that can be viewed with an optical microscope.

A semiconductor chip is a thin, flat, structure, square as seen from the top (the surface that supports conductors and receives diffusions). It has sides a few millimeters long. It will be helpful to describe the chip with the plane of the top horizontal and facing upward. (This is the usual orientation in patent drawings but is not necessarily the orientation of the chip in a circuit device.) In this arbitrary orientation, the edge surfaces extend vertically and horizontally.

In one of the first steps in preparing an SEM specimen, an edge of the chip is ground to make a cut in a vertical plane at the location of the defect.

THE PRIOR ART

In a prior art method of sectioning a chip, the operator of the grinder must estimate the thickness of material to be removed, and during the grinding operation the operator must check the chip frequently with an optical microscope to judge how much more grinding is required. This method of sectioning the chip is of course very time consuming. It is also possible to grind past a defect.

SUMMARY OF THE INVENTION

A general object of this invention is to provide a new and improved method for grinding a chip edge to expose a section for observation with an SEM.

Although the improved method of this invention has several steps that are not required in the prior art, it eliminates the checks otherwise made by the operator in the prior art. Consequently, the total time for sectioning a chip should be about a third of the time required in the prior art.

To simplify the explanation, it will help to establish terminology for the orientation of the chip. The SEM view is from the edge. One edge is selected to be the edge that will be ground away, and it will be called the grinding edge or the exposed edge, depending on the context. In concept, a section line could be drawn across the top surface, overlying the defect and parallel to the grinding edge.

In a first step, the operator locates a defect by viewing the top of the chip with an optical microscope, using information about the position of the defect, as is done in the prior art use of an SEM.

The operator then mounts the chip on a suitable support that also holds a mask and an x-y positioner for the mask. The mask is used for depositing a metal coating on the top surface of the chip. The mask is given a general shape to form a conductive pattern in the coating and it is more specifically shaped to form a visual pointer to the defect.

The preferred mask is conventional except that it forms a pointer with a long narrow shape with a point at one end. The operator positions the mask over the chip so that the pointer extends from the edge opposite the grinding edge to a point suitably near the defect. The range of this point is between a few tens of microns to hundreds of microns and is about 20 microns in the preferred embodiment.

The distance between the tip of the pointer and the defect is small enough that the operator using an optical microscope and the usual range of magnification can see both the defect and the tip at the same time.

The support with the chip, the mask and the x-y positioner holding the mask is then placed in a metal coating apparatus and a film of metal is formed over the top of the chip, except in the area underlying the pointer formed by the mask. This coating is made with a highly conductive metal and it is made thick enough to give the coating a measurable resistance. The metal is preferably gold or platinum and the preferred thickness is in the range of 200 to 1000 angstroms, as is conventional in the use of an SEM.

When the chip has been removed from the metal coater, the top surface has a metal coating, except for the pointer formed by the mask, and the operator can easily locate the defect with an optical microscope in some of the later steps of this method. (The metal coating is thin enough to be suitably transparent.)

The metal coating forms a generally U-shaped conductive path around the non-conductive pointer, and connections are made near the corners of the opposite edge for measuring the resistance of this path. The path resistance increases as the grinding operation proceeds, and this resistance change is monitored to control the grinding operation, and the operation proceeds without further visual checks.

A first resistance measurement is made before the grinding operation is begun. The chip is then positioned in a grinder and in an initial grinding operation the grinding edge of the chip is ground away for a measured distance that is suitably below the defect. Then a second resistance measurement is made.

From the two resistance measurements, the resistance is calculated for the film when the grinding has proceeded to the defect. The calculations are explained later in this specification. The grinding operation is then run until the resistance reading shows that the grinding has reached the section line of the defect.

In concept, the person operating the grinder can watch an ohm meter and stop grinding when the calculated resistance value is reached. Techniques for automating this step will be understood without specific description, and conventional equipment can signal the operator when the calculated resistance value has been reached or it can turn off the grinder when this value has been reached.

Other objects and advantages of the invention will become apparent in the description of the preferred embodiment.

THE DRAWING

THE PREFERRED EMBODIMENT

Figure 1:
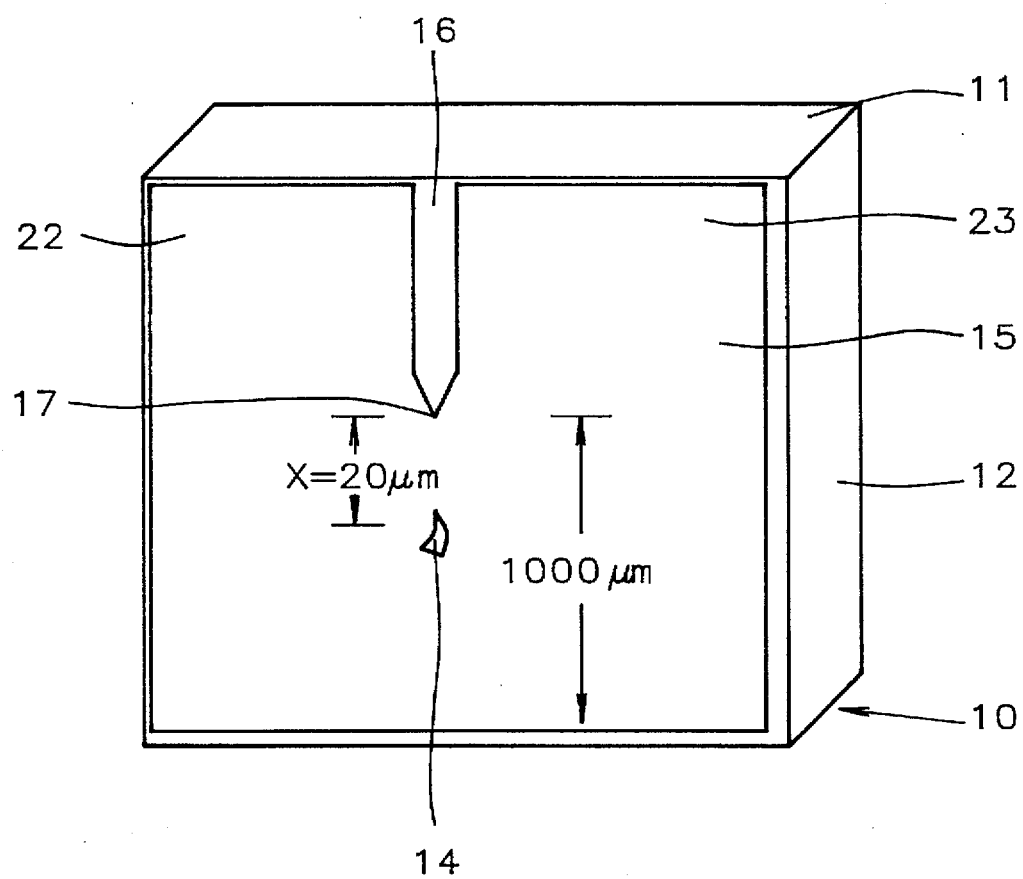
FIG. 1 is an isometric view of a specimen with the metal coating and pointer used in the method of this invention.

Introduction—FIG. 1

FIG. 1 shows a chip 10 that is oriented with its grinding edge facing downward (and hidden in the drawing) and its opposite edge 11 uppermost in the drawing. One other edge 13 is shown in FIG. 1 in a vertical plane, and the other edge is hidden. FIG. 1 also shows a representative defect 14. From a more general standpoint, the defect is a point of interest where the chip will be viewed in section with an SEM.

A conductive film 15 is formed on the outwardly facing surface of the chip. The preferred film thickness is 200 to 1000 Angstroms. (The thickness affects the resistance of the film pattern, as will be understood from the later description of the resistance calculation.) A masking step (described later) has formed a pointer 16 with a downward pointing arrow tip 17. This pointer is formed by the silicon underlying the film and is visually distinct from the metal.

The length of the pointer (from the edge of opposite surface 11 to tip 17) depends on the location of the defect, but the chip will be oriented so that the grinding edge is the edge closest to the defect, and the length of the pointer will be less than half the length of a chip edge (a few millimeters). Preferably, as the drawing represents, the grinding surface is perpendicular to the long direction of the pointer.

The pointer 16 gives the film pattern 12 a generally U-shape, and conductors 19, 20 (see FIG. 4) are connected in the corners 22, 23 respectively for connecting resistance measuring apparatus (e.g. an ohm meter, not shown) to the film. Suitably accurate ohm meters are in common use in semiconductor laboratories and manufacturing plants.

The tip 17 of the pointer is suitably spaced from the final position of the grinding edge to maintain a suitable conductivity. (The circuit would be broken if the grinding is continued to the tip of the pointer; similarly, the resistance would rise rapidly and thereby lose resolution if the grinding is continued very close to the pointer.) The minimum distance will be from a few tens of microns to about 100 microns. FIG. 1 shows a preferred distance of 20 microns. In FIG. 1 the spacing between defect 14 and tip 17 is exaggerated to provide room for a legend. FIG. 1 also shows a representative distance of 1000 microns between the initial grinding edge and the pointer tip; the actual distance of course depends on the location of the defect. These features of the specimen coating will be understood further from the description of the calculation of the resistance that signifies the grinding distance.

The Calculation—FIG. 2

The conductive path can be understood by thinking of film 15 as being divided into three generally rectangular parts: two rectangles 27, 28 for vertical paths on each side of pointer 16, and a rectangle 30 for a horizontal path below the notch. (The paths are simplified here but will be explained more exactly.) The distance L in the drawing is the width of the conductive path through rectangle 30 before the grinding is begun. X is a variable that denotes the actual width of the conductive path between the grinding edge and the tip of the pointer. (In FIG. 1, X is the final distance between the grinding edge and the tip of the pointer.) As can be seen approximately in the drawing and as will be explained in detail, X is the most significant factor in the resistance of the path between conductors 19 and 20 (because it is the narrowest part of the path), and the relative sizes and shapes of rectangles 27 and 28 are less significant.

The resistance of the conductive film pattern is given by the following equation.

$$\Omega = \Omega_0 (1/X)^n \quad (1)$$

The symbol $\Omega$ (the Greek letter omega) denotes the resistance of the path when the grinding operation has reached its preselected limit. The symbol $\Omega_0$ denotes the resistance during an initial measurement step. The term X in the equation is the variable introduced earlier that denotes the width of the conductive path formed by block 30. Note that the value of X changes during the grinding operation.

The exponent n compensates for the fact that the current density is not uniform along the conductive path. As an intuitive explanation, if the path width X is doubled, the resistance will not be cut in half because the newly formed paths that would take advantage of the increase in width X are longer than the original path from a corner 27 or 28 to the tip 17 of the pointer. For another simplified explanation of the exponent, note that the special case n=1 is the resistance of a conductive block of a given length and thickness and width L as given in elementary texts in which the current density is assumed to be uniform.

This equation is a close solution to the resistance of the film pattern and it is adequate, even for the small dimensions and small resistance values encountered in using this method.

Equation (1) is developed from the following equation.

$$\Omega \propto (1/L)^n \quad (2)$$

Figure 2A:
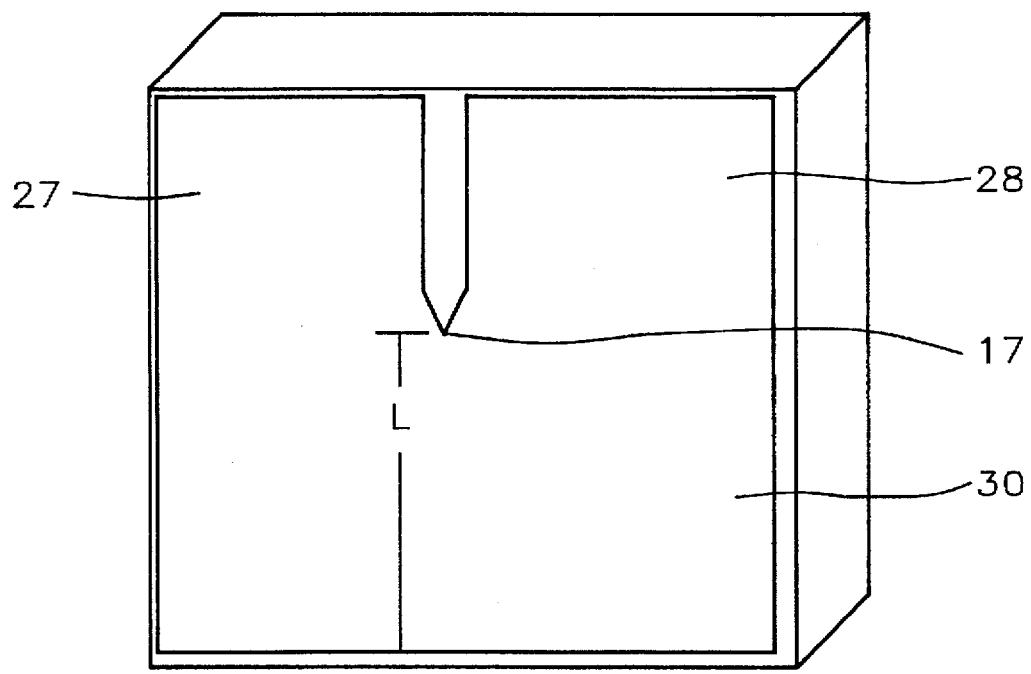
FIG. 2A is a schematic drawing of the chip and the conductive film with notation for explaining a resistance calculation before the grinding operation is begun.
Figure 2B:
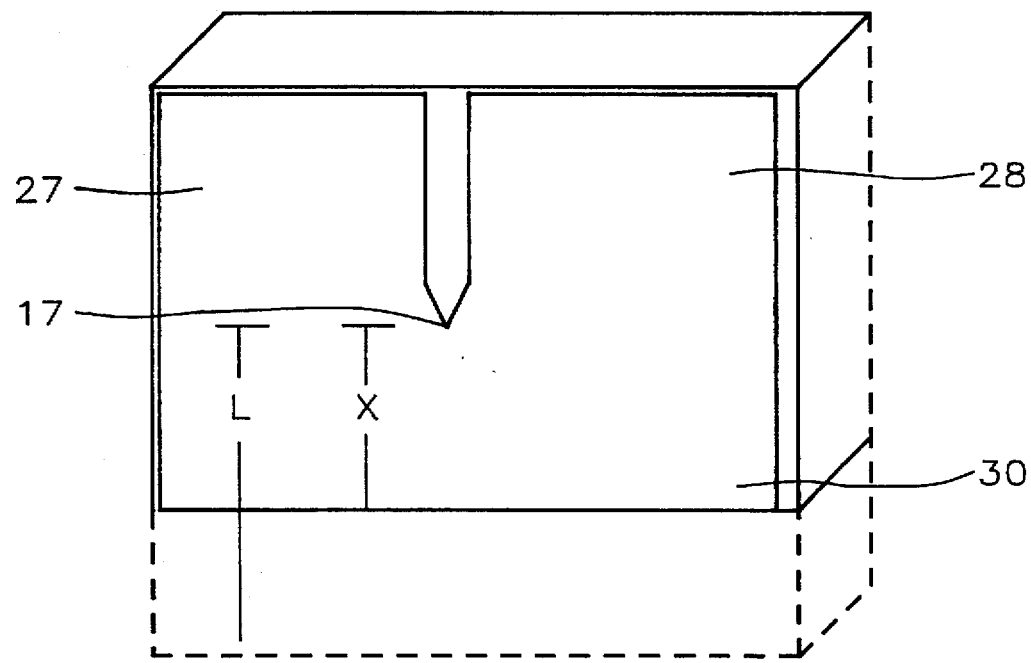
FIG. 2B is a similar drawing with notation for explaining the resistance when part of the chip grinding edge has been removed.

In equation (2), L is the initial width of a conductive path, as can be seen in FIGS. 2A and 2B. This term appears as a reciprocal in equation (2) and X appears as a reciprocal in equation (1) because the resistance of a conducting path is inversely proportional to the area normal to the current direction. The thickness of the metal film that forms the path does not appear in the equation because it is substantially constant. When the right side of equation (2) is multiplied by a constant, k, the proportionality is converted to an equality expressed in equation (3).

$$\Omega = k(1/L)^n \quad (3)$$

The constant k includes terms for the thickness of the path and the length of the path, both of which are constants and are not separately measured.

The symbol $\Omega_0$ represents the resistance measured in the initial measurement, before the grinding step. Equation (4) relates the terms of this measurement.

$$\Omega_0 = k(1/L)^n \quad (4)$$

L is given the value 1 for this initial measurement, and the equation becomes $\Omega_0 = k$. Thus $\Omega_0$, from the initial measurement, replaces k in the equation, and equation (5) results.

$$\Omega = \Omega_0 (1/X)^n \quad (5)$$

The exponent n is found by performing an experiment: first the resistance is measured, then a predetermined distance X is ground away and the resistance is measured again. This process gives all of the terms of equation (5) except the exponent n, which can be found easily by elementary algebra (log $\Omega/\Omega_0 = -n \log X$).

In FIGS. 2A and 2B, L denotes the distance between the bottom of the notch and the grinding edge of the chip. X denotes the distance between the bottom of the notch and section line where the grinding operation is to stop.

The calculations can be performed easily with a suitable hand held calculator, or a program to perform these calculations on a computer can be written easily in any convenient programming language.

Figure 3:
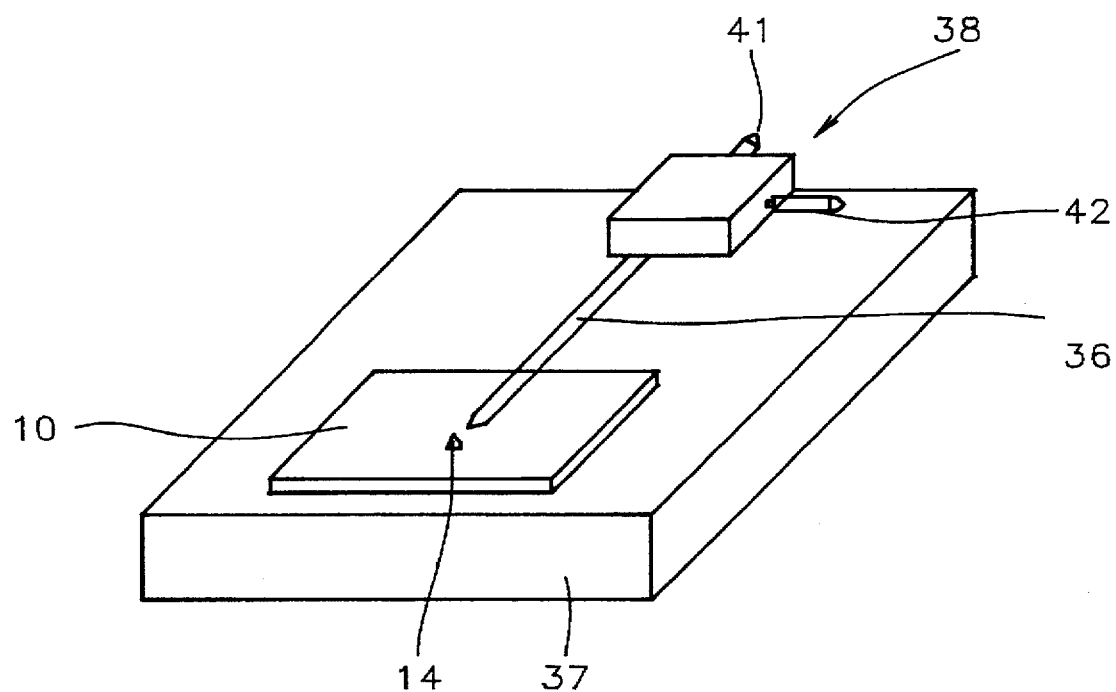
FIG. 3 is an isometric drawing of apparatus for masking the chip to form the pointer.

Coating the Chip—FIG. 3

In FIG. 3, the chip 10 and its defect 14 will be recognized from these components in FIG. 1 and a mask 36 will be recognized from the similarity of its shape to pointer 16. The chip is mounted on a support 37 that is suitable for the coating step. The chip is located on support 37 with its grinding edge farthest from the mask and at right angles to the long direction of the mask.

An x-y positioner 38 is also mounted on support 37, and mask 36 is arranged to be positioned over the chip surface by positioner 38. The positioner is operated manually, as shown by positioning knobs 41 and 42.

An person preparing the chip for the coating step uses an optical microscope to view the defect 14 and the tip of mask 36 and to measure the distance between the tip and the defect. The operator of the x-y positioner locates the mask to form the pointer 16 as already explained. The support and the other components shown in FIG. 3 are placed in a coating apparatus and the metal pattern 15 of FIG. 1 is formed on the chip.

The distances in the calculation have been described with reference to the tip of the pointer, instead of to the defect, because the distance to the tip is easy to measure and the difference is negligibly small. If the difference is not negligible in a specific case, the value of L can be measured from the initial grinding edge to the defect instead of from the initial grinding edge to the tip of the pointer.

Figure 4:
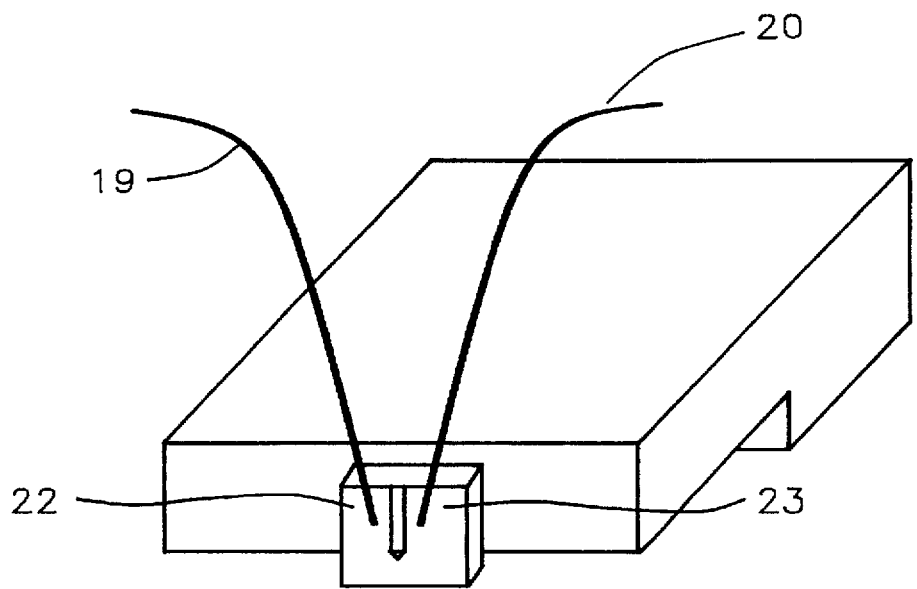
FIG. 4 is a schematic drawing of the chip and part of the grinding apparatus.

The Grinding Operation—FIG. 4

When the chip has been given the metal pattern 15 of FIG. 1, wires 19 and 20 are attached to the corners and the chip is mounted in a holder 44 of a grinder. The first grinding operation is performed and the resistance between the wires is measured. The second grinding operation is performed and a second resistance measurement is made. The resistance to be expected when the grinding operation has been completed is calculated in the way already described and the grinding operation continues until the resistance signifies that the desired position has been reached.

OTHER EMBODIMENTS

Sometimes SEM sections are formed on a slant instead at right angles to the top surface. In the method represented in the drawing, the resistance measurements are affected only by the thin layer of metal on the top of the chip, and the method can be readily adapted to the method represented in the drawing.

From the description of the preferred embodiment of the invention and the specific suggestions for variations, those skilled in the art will recognize various modifications of the preferred method within the spirit of the invention and the intended scope of the claims.

We claim:

1. A method for grinding a semiconductor chip to a selected section line for viewing a defect or other target with a scanning electron microscope, comprising the following steps, selecting an edge of the chip for the grinding operation, said edge being identified as the grinding edge, coating the top surface of the chip with a conductive material while masking a region extending from the edge opposite the grinding edge to a position short of the target, whereby the top surface of the chip is given a conductive path in a U shaped pattern, connecting conductors to the ends of the U shaped pattern and making a first measurement of the resistance of the path, grinding the chip at said grinding edge, whereby the overlying conductive material is removed, the amount of said grinding being sufficient to produce a measurable increase in the resistance of the path, making a second measurement of the resistance of the path, and monitoring the resistance of the path while grinding the chip grinding edge until the resistance of the path reaches a final resistance value calculated from the first and second measurements for the resistance when the coating has been removed by grinding to the selected section line.

2. The method of claim 1 wherein the step of coating the top of the chip includes coating to a thickness in the range of 200 to 1000 angstroms.

3. The method of claim 2 wherein the step of coating the top of the chip includes coating with gold or platinum.

4. The method of claim 2 wherein the step of coating includes masking the chip to form a visual pointer for aiding an operator to see the target.

5. The method of claim 4 wherein the step of forming a visual pointer includes masking the chip to form a pointer with a tip spaced from the target.

6. The method of claim 5 wherein the step of forming a tip spaced from the target includes forming the pointer with the tip spaced about 20 microns from the target in the direction of the opposite edge.

7. The method of claim 2 including the step of calculating the final resistance value.

8. The method of claim 7 wherein the step of calculating includes calculating the final resistance value as an exponential function of the distance between the initial grinding edge and the final grinding edge.

9. The method of claim 8 wherein the exponent is calculated from the first resistance measurement at the initial grinding edge of the chip, the second resistance measurement at the final grinding edge of the chip and the distance between the initial edge and the final edge.

10. The method of claim 9 wherein the step of calculating includes calculating according to the equation $\Omega = \Omega_0 (1/X)^n$, where X is a variable denoting the width of the conducting path between the tip of the pointer and the grinding edge, $\Omega$ is the resistance of the path for a given width X, $\Omega_0$ is the resistance of the path during the first measurement and the exponent n compensates in the equation for the non-linearity of the resistance as a function of X.

* * * * *